(12) United States Patent
Sidhu et al.

(10) Patent No.: US 9,283,641 B2
(45) Date of Patent: Mar. 15, 2016

(54) FLUX MATERIALS FOR HEATED SOLDER PLACEMENT AND ASSOCIATED TECHNIQUES AND CONFIGURATIONS

(71) Applicant: INTEL CORPORATION, Santa Clara, CA (US)

(72) Inventors: Rajen S. Sidhu, Chandler, AZ (US); Martha A. Dudek, Chandler, AZ (US); Wei Tan, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 603 days.

(21) Appl. No.: 13/626,869

(22) Filed: Sep. 25, 2012

(65) Prior Publication Data

US 2014/0084461 A1    Mar. 27, 2014

(51) Int. Cl.
| | |
|---|---|
| *B23K 35/36* | (2006.01) |
| *B23K 35/02* | (2006.01) |
| *H01L 21/48* | (2006.01) |
| *B23K 35/362* | (2006.01) |
| *H01L 23/498* | (2006.01) |

(52) U.S. Cl.
CPC ........... *B23K 35/362* (2013.01); *B23K 35/0244* (2013.01); *B23K 35/3612* (2013.01); *H01L 21/4853* (2013.01); *H01L 23/49816* (2013.01); *H01L 2224/16225* (2013.01)

(58) Field of Classification Search
None
See application file for complete search history.

(56) References Cited

U.S. PATENT DOCUMENTS

2008/0157353 A1*  7/2008  Watanabe et al. ............. 257/734

OTHER PUBLICATIONS

International Application No. PCT/US11/67277, Filed on Dec. 23, 2011.

* cited by examiner

*Primary Examiner* — Sheeba Ahmed
(74) *Attorney, Agent, or Firm* — Schwabe, Williamson & Wyatt P.C.

(57) ABSTRACT

Embodiments of the present disclosure are directed towards flux materials for heated solder placement and associated techniques and configurations. In one embodiment, a method includes depositing a flux material on one or more pads of a package substrate, the flux material including a rosin material and a thixotropic agent and depositing one or more solder balls on the flux material disposed on the one or more pads, wherein depositing the one or more solder balls on the flux material is performed at a temperature greater than 80° C., and wherein the rosin material and the thixotropic agent are configured to resist softening at the temperature greater than 80° C. Other embodiments may be described and/or claimed.

26 Claims, 4 Drawing Sheets

FLUX MATERIALS FOR HEATED SOLDER PLACEMENT AND ASSOCIATED TECHNIQUES AND CONFIGURATIONS

FIELD

Embodiments of the present disclosure generally relate to the field of integrated circuits, and more particularly, to flux materials for heated solder placement and associated techniques and configurations.

BACKGROUND

An integrated circuit (IC) device such as, for example, a die may be mounted on a package substrate to form a package assembly. Solder balls may be attached to the package substrate to facilitate routing of electrical signals between the package substrate (e.g., and the die) and another electrical component such as, for example, a motherboard. In some cases, the package substrate may be warped as a result of a difference in coefficient of thermal expansion between materials of the package substrate and the mounted IC device. The warped package may result in misalignment of the solder ball placement during a ball attach process, which may lead to defective failures in forming the solder ball connections to the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 2A schematically illustrates an IC package assembly subsequent to depositing a flux material on one or more pads of the package substrate, in accordance with some embodiments.

FIG. 2B schematically illustrates an IC package assembly subsequent to depositing one or more solder balls on the flux material disposed on the one or more pads, in accordance with some embodiments.

FIG. 2C schematically illustrates an IC package assembly subsequent to performing a solder reflow process to form a solder connection between the one or more solder balls and the one or more pads of the package substrate, in accordance with some embodiments.

DETAILED DESCRIPTION

Figure 1:
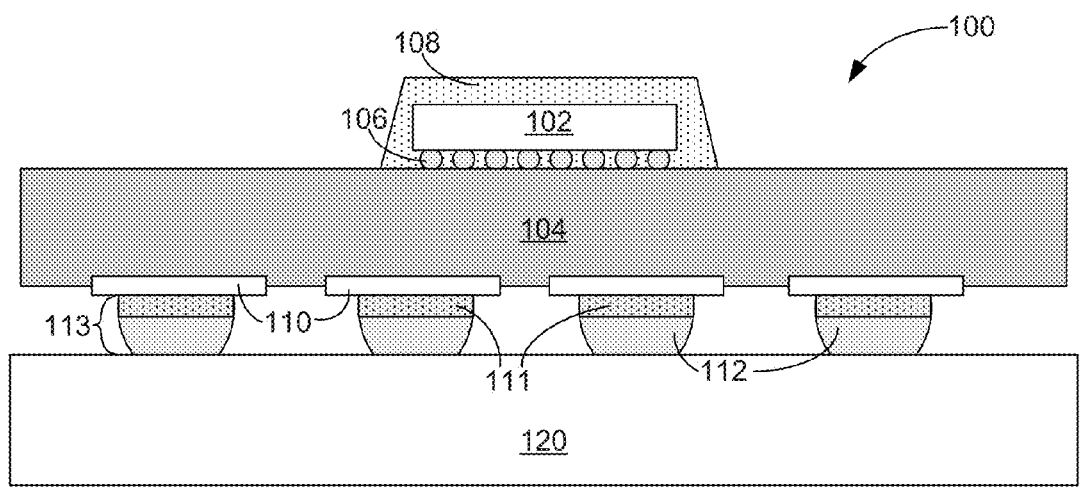
FIG. 1 schematically illustrates a cross-section side view of an example integrated circuit (IC) package assembly, in accordance with some embodiments.

Embodiments of the present disclosure describe flux materials for heated solder placement and associated techniques and configurations. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100, in accordance with some embodiments. The IC package assembly 100 may include a package substrate 104 having one or more dies (hereinafter "die 102") mounted on the package substrate 104.

The die 102 can be attached to the package substrate 104 according to a variety of suitable configurations including, a flip-chip configuration, as depicted, or other configurations such as wirebonding and the like. In the flip-chip configuration, an active side of the die 102 is attached to a surface of the package substrate 104 using die interconnect structures 106 such as bumps, pillars, or other suitable structures. The active side of the die 102 may have one or more transistor devices formed thereon. The die 102 may represent a discrete chip. The die 102 may be, include, or be a part of a processor, memory, or ASIC in some embodiments. In some embodiments, an encapsulant 108 such as, for example, molding compound or underfill material may fully or partially encapsulate the die 102.

Die interconnect structures 106 such as, for example, bumps may be configured to route electrical signals between the die 102 and the package substrate 104. In some embodiments, the die interconnect structures 106 may be configured to route electrical signals such as, for example, input/output (I/O) signals and/or power or ground signals associated with the operation of the die 102.

The package substrate 104 may include electrical routing features configured to route electrical signals to or from the die 102. The electrical routing features may include, for example, traces (not shown) disposed on one or more surfaces of the package substrate 104 and/or internal routing features such as, for example, trenches, vias or other interconnect structures (not shown) to route electrical signals through the package substrate 104. For example, in some embodiments, the package substrate 104 may include electrical routing features such as die bond pads (not shown) configured to receive the die interconnect structures 106 and route electrical signals between the die 102 and the package substrate 104.

Package level interconnects 113 such as, for example, solder balls, may be coupled to one or more pads 110 on the package substrate 104 to further route the electrical signals to another electrical device 120 (e.g., motherboard or other circuit board). Although not shown, the other electrical device 120 may have corresponding pads or other interconnect structures to receive the solderable material 112. In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments.

In some embodiments, the package level interconnects 113 may include a solderable material 112 such as, for example, one or more solder balls (e.g., solder balls 312 of FIG. 2B) that are coupled to the one or more pads 110 using a reflow process. A flux material 111 may be disposed between the solderable material 112 and the one or more pads 110 to facilitate formation of a solder connection during the solder reflow process. The solder reflow process may form a solder connection between the solderable material 112 and the one or more pads 110. In some embodiments, the solder connection of the package level interconnects 113 may include intermetallic compound formed from materials of the solderable material 112, the flux material 111 and/or the one or more pads 110. Although the flux material 111 is depicted with clean, straight lines, a boundary of the flux material 111 may be nonlinear or may otherwise include other shapes or profiles in accordance with various embodiments.

In some embodiments, the package substrate 104 may be heated during a ball attach process, referred to as a heated solder placement process, to attach the one or more solder balls (e.g., solderable material 112) to the one or more pads 110. The heated solder placement technique may apply heat to the package substrate 104 during a ball attach process to reduce warpage of the package substrate 104 that may be caused by differences in Coefficient of Thermal Expansion (CTE) of material of the IC package assembly 100 and, thus, improve alignment and placement of the solder balls on target pads of the one or more pads 110. The improved alignment and placement of the solder balls may avoid defective failures or other yield loss associated with the package level interconnects 113.

According to various embodiments, the flux material 111 may be formulated to resist softening at elevated temperatures associated with the heated solder placement. In some embodiments, the flux material 111 is configured to resist softening at temperatures greater than about 80° C. and, in particular, at temperatures between 80° C. and 120° C. For example, the flux material 111 may be composed of materials that have a softening point temperature that is greater than a temperature of the heated solder placement process. Such characteristic may provide a flux material 111 that does not bleed during the heated solder placement. The flux material 111 may further retain a tackiness characteristic at the elevated temperature of the heated solder placement such that the solder balls adhere to the flux material 111 when placed or dropped on the flux material 111 during a ball attach process. Such characteristics of the flux material 111 may reduce defects such as high or missing balls, merged balls, bridging balls, and the like, which may be associated with other flux materials that may soften (e.g., bleed) or lose tackiness at elevated temperatures.

Figure 2A:
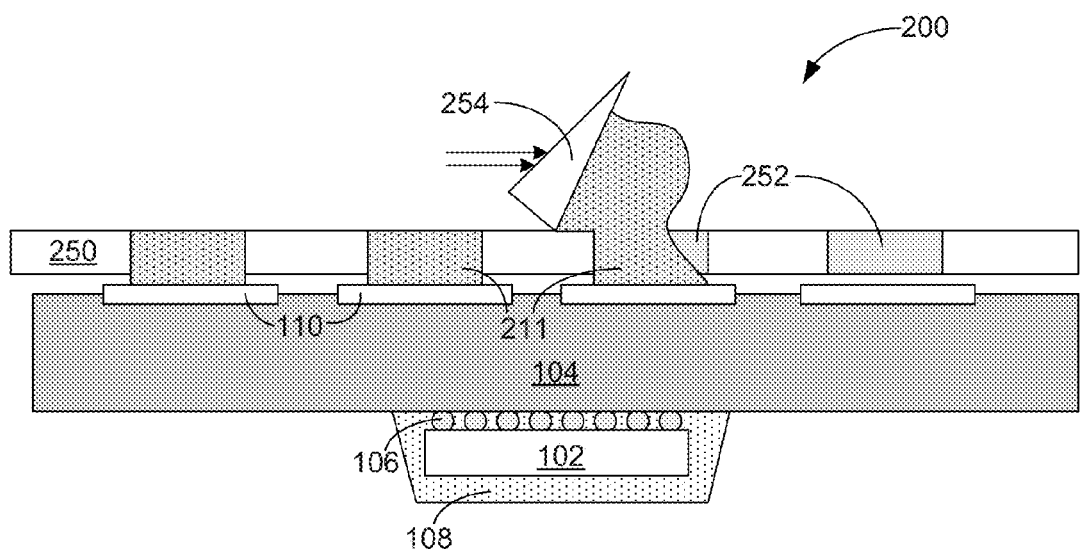
FIGS. 2A-C schematically illustrate an IC package assembly subsequent to various process operations.
Figure 2B:
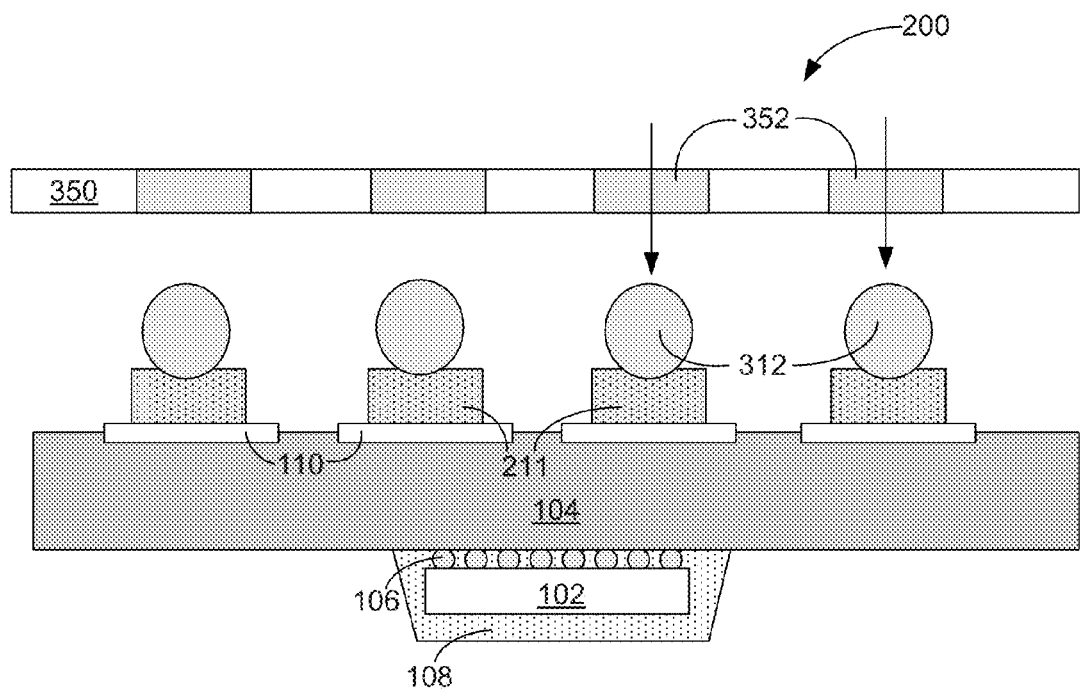
Figure 2C:
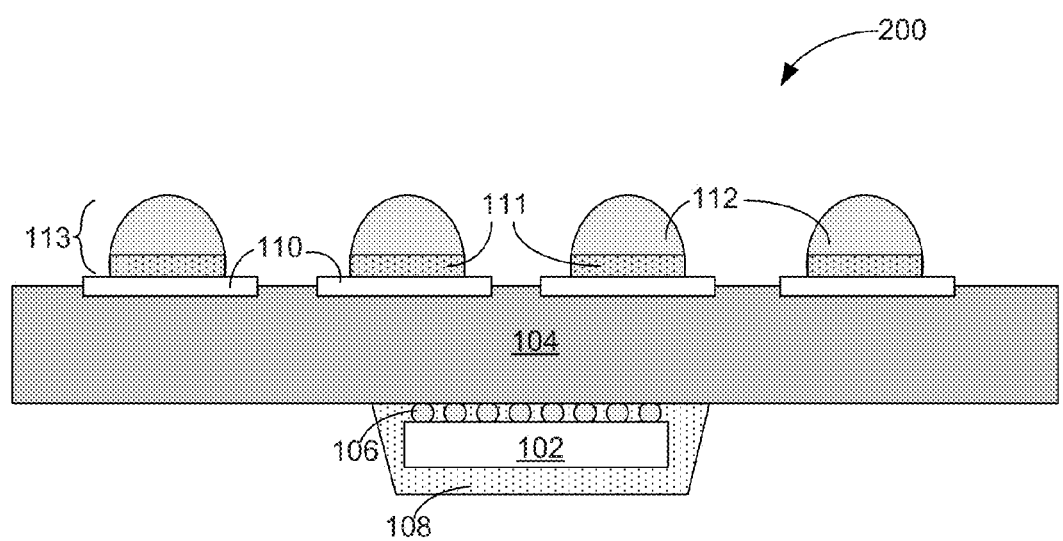

FIGS. 2A-C schematically illustrate an IC package assembly 200 subsequent to various process operations. FIG. 2A schematically illustrates an IC package assembly 200 subsequent to depositing a flux material 211 on one or more pads 110 of the package substrate 104, in accordance with some embodiments. In the depicted embodiment, the IC package assembly 200 is shown subsequent to depositing flux material on the one or more pads 110 of the package substrate 104 using a stencil printing method. For example, the flux material 211 may be pushed through one or more openings 252 of a stencil 250 adjacent to the one or more pads 110. A squeegee 254 or analogous feature may be used to push (e.g., in the direction indicated by the arrows) the flux material 211 through the one or more openings 252. The flux material 211 may be deposited on the one or more pads 110 using other suitable deposition techniques in other embodiments.

In some embodiments, the flux material 211 may be a formulation including one or more of a rosin, thixotropic agent, solvent, amine, and acid. The acid may include, for example, mono-, di-, and/or tri-carboxylic acids having between about 2 and 40 carbon atoms. For example, in some embodiments, the organic acid may include glycolic acid, oxalic acid, succinic acid, malonic acid, and the like, or combinations thereof. The amine may include, for example, primary, secondary, and/or tertiary amines having between about 4 to 40 carbon atoms. For example, in some embodiments, the amine may include butyl amine, diethylbutyl amine, dimethylhexyl amine, and the like, or combinations thereof. The rosin may include, for example, naturally occurring or synthetically formulated rosin. The solvent may include any of a wide variety of suitable solvents.

In some embodiments, the flux material 211 may further include a metal powder (e.g., solder powder) such as, for example, tin, silver, or copper to provide an electrically conductive solder paste. According to various embodiments, the flux material 211 may include a mixture of flux (e.g., rosin, thixotropic agent, solvent, amine, and acid) ranging from about 10% to 40% of the mixture by weight and metal powder ranging from about 60% to 90% of the mixture by weight. The flux material 211 may be combined with the metal powder in a mixer to form the solder paste. In some embodiments, the flux material 211 is a low metal loading (LML) material.

Components of the flux material 211 may be composed of solid materials that resist softening at temperatures associated with heated solder placement. For example, in some embodiments, the rosin and/or the thixotropic agent may resist softening at a temperature greater than 80° C. In some embodiments, the flux material 211 may resist softening at a temperature ranging between 80° C. and 120° C. The flux material 211 may resist softening at lower or higher temperatures of a heated solder placement process, in other embodiments.

A softening point temperature of components of the flux material 211 may be increased by increasing a molecular weight of the components. For example, in some embodiments, the flux material 211 may be composed of a rosin having a molecular weight greater than 300 and/or a thixotropic agent having a molecular weight greater than 500. The rosin and the thixotropic agent may have other values for molecular weight in other embodiments.

In some embodiments, the flux material 211 may have a viscosity ranging from 1 pascal·second (Pa·s) to 300 Pa·s at a temperature of the heated solder placement and/or a thixotropic index (TI) ranging from 0.1 to 0.4 at a temperature of the heated solder placement. The flux material 211 may flow through the openings 252 of the stencil 250 and adhere to the one or more pads 110 without subsequent bleeding. In some embodiments, the flux material 211 may have a tackiness greater than 40 gram-force (gf) to facilitate adherence of one or more solder balls (e.g., one or more solder balls 312 of FIG. 3) to the flux material 211 at the heated solder placement temperature (e.g., greater than 80° C.).

According to various embodiments, the rosin may include, for example, a combination of one or more rosin systems (e.g., rosin esters, hydrogenated rosin resins, dimerized rosin resins, modified rosin resins). In some embodiments, the flux (e.g., components of the flux material except the metal powder) may include from 10% to 80% rosin by weight. According to various embodiments, the thixotropic agent may include, for example, agents for use in cross-linking systems, such as, for example, modified organic bentonites, amide waxes, and/or hydrolyzed castor oils, or combinations thereof. In some embodiments, the flux (e.g., components of the flux material except the metal powder) may include from 10% to 80% thixotropic agent by weight. The amount (weight %) of rosin and/or thixotropic agent in the flux may depend on a molecular weight (e.g., 350 to 450) and softening temperature (e.g., 150° C. to 190° C.) of the thixotropic agent. For example, a lower percentage of the thixotropic agent and/or rosin may be needed to elevate the softening temperature of the flux material 211 for heated solder placement for a higher molecular weight or higher softening temperature material.

FIG. 2B schematically illustrates the IC package assembly 200 subsequent to depositing one or more solder balls 312 on the flux material 211 disposed on the one or more pads 110, in accordance with some embodiments. In the depicted embodiment, the IC package assembly 220 is shown subsequent to depositing one or more solder balls 312 using a heated solder placement process.

Heat may be applied to the package substrate 104 (e.g., in a range of about 80° C. to 120° C.) to reduce warpage of the package substrate and, thus, facilitate a more precise alignment of the solder balls 312 relative to the one or more pads 110. The flux material 211 may be formulated to resist softening during the heated solder placement.

In some embodiments, the flux material 211 may have a tackiness greater than 40 gram-force (gf) at the heated solder placement temperature to facilitate adherence of the one or more solder balls 312 to the flux material 211. For example, in the depicted embodiments, the solder balls 312 may be dropped in the direction of the arrows through openings 352 in a patterned grid 350 onto the flux material 211, as can be seen. The flux material 211 may have the tackiness greater than 40 gf such that the dropped or placed balls adhere to the flux material 211 prior to performing a solder reflow process as described in connection with FIG. 2C. The solder balls 312 (e.g., or more generally the solderable material 112 of FIG. 1) may be deposited using other suitable techniques in other embodiments.

FIG. 2C schematically illustrates the IC package assembly 200 subsequent to performing a solder reflow process to form a solder connection between the one or more solder balls (e.g., solderable material 112) and the one or more pads (e.g., pads 110) of the package substrate 104, in accordance with some embodiments. According to various embodiments, the solder reflow process may be performed by applying heat to the package substrate to soften the solderable material 112 (e.g., solder balls 312 of FIG. 2B) and metal powder, if any, of the flux material (e.g., flux material 211 of FIG. 2B) to form package level interconnects 113 that include the flux material 111 that has undergone the reflow process. In some embodiments, the reflow process forms a mechanical and electrical bond between the solderable material 112 and the one or more pads 110.

Although in the depicted embodiments of FIGS. 2A-C, the IC package assembly 200 includes the die 102 attached to the package substrate 104, in other embodiments, the IC package assembly 200 may include the package substrate 104 without having the attached die 102 during processing described in connection with FIGS. 2A-C. For example, the die 102 may be attached subsequent to performing the solder reflow process to form the package level interconnects 113 of FIG. 2C in some embodiments.

Figure 3:
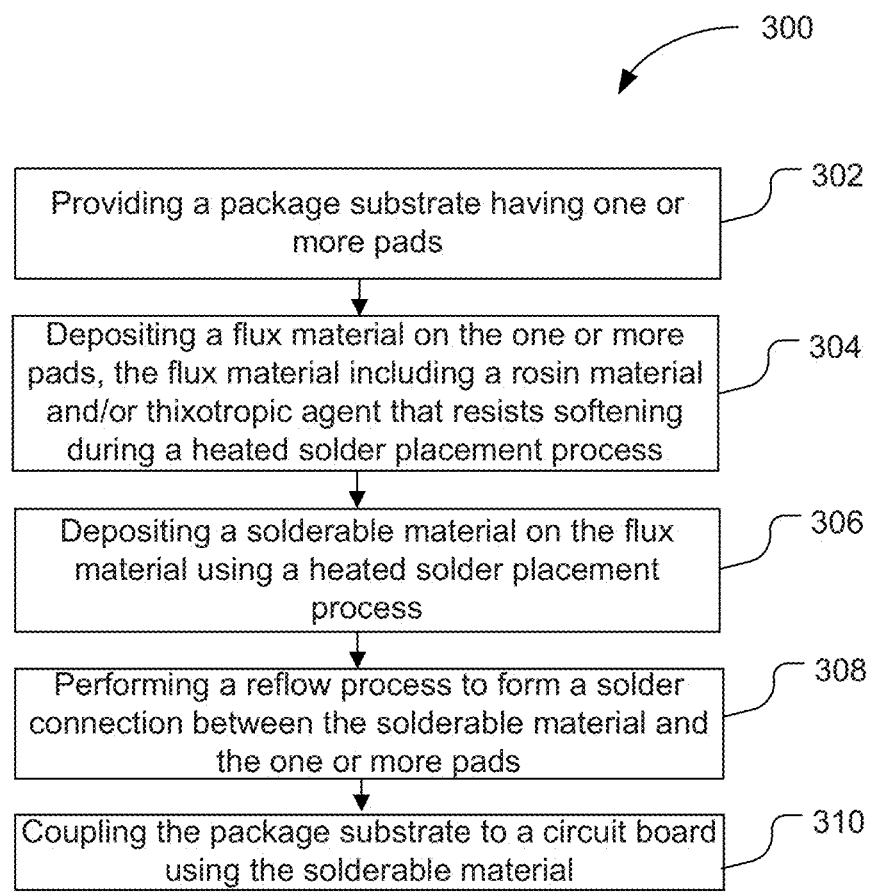
FIG. 3 schematically illustrates a flow diagram for a method of fabricating an IC package assembly, in accordance with some embodiments.

FIG. 3 schematically illustrates a flow diagram for a method 300 of fabricating an IC package assembly (e.g., the IC package assembly 100 of FIG. 1), in accordance with some embodiments. The method 300 may comport with embodiments described in connection with FIGS. 1-2C.

At 302, the method 300 may include providing a package substrate having one or more pads (e.g., one or more pads 110 of FIG. 1). The one or more pads may be composed of an electrically conductive material such as metal (e.g., copper) and may be configured to route I/O signals of a die that is mounted or that will be mounted on the package substrate.

At 304, the method 300 may further include depositing a flux material (e.g., flux material 211 of FIG. 2) on the one or more pads. In some embodiments, the flux material may be deposited using a stencil printing technique. In other embodiments, the flux material may be deposited using other suitable deposition techniques.

At 306, the method 300 may further include depositing a solderable material (e.g., one or more solder balls 312 of FIG. 2B) on the flux material using a heated solder placement process. The solderable material may be deposited using any suitable process including, for example, techniques to drop or otherwise place solder balls on the flux material. The flux material may resist softening to avoid bleeding and/or have tackiness that promotes adhesion of solderable material to the flux material during the heated solder placement.

At 308, the method 300 may further include performing a reflow process to form a solder connection between the solderable material and the one or more pads. The solder connection may include the flux material in some embodiments.

In some embodiments, package level interconnects (e.g., package level interconnects 113 of FIG. 1) are arranged in an array on the package substrate at a pitch of less than about 0.3 millimeters from one another.

At 310, the method 300 may further include coupling the package substrate to a circuit board (e.g., electrical device 120 of FIG. 1) using the solderable material. The package substrate may be coupled to the circuit board using any suitable technique including, for example, soldering techniques to couple the package level interconnects to the circuit board.

Figure 4:
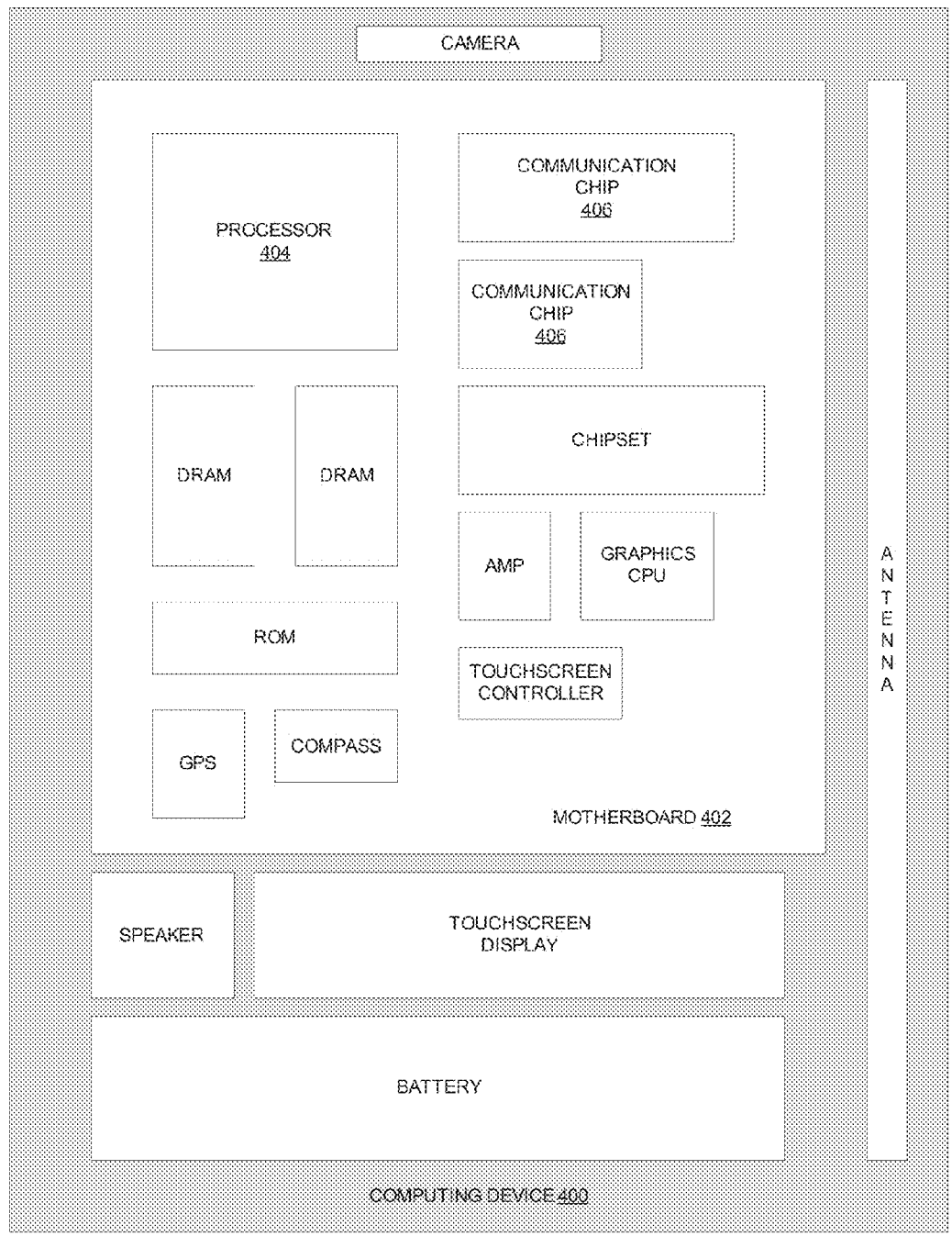
FIG. 4 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 4 schematically illustrates a computing device 400 in accordance with one implementation of the invention. The computing device 400 may house a board such as motherboard 402. The motherboard 402 may include a number of components, including but not limited to a processor 404 and at least one communication chip 406. The processor 404 may be physically and electrically coupled to the motherboard 402. In some implementations, the at least one communication chip 406 may also be physically and electrically coupled to the motherboard 402. In further implementations, the communication chip 406 may be part of the processor 404.

Depending on its applications, computing device 400 may include other components that may or may not be physically and electrically coupled to the motherboard 402. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other embodiments.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 may include a die (e.g., die 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 406 may also include a die (e.g., die 102 of FIG. 1) in an IC package assembly (e.g., IC package assembly 100 of FIG. 1) as described herein. In further implementations, another component (e.g., memory device or other integrated circuit device) housed within the computing device 400 may contain a die (e.g., die 102 of FIG. 1) in an IC package assembly (e.g., IC package assembly 100 of FIG. 1) as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:
1. A method comprising:
depositing a flux material on one or more pads of a package substrate, the flux material including a rosin material and a thixotropic agent; and depositing one or more solder balls on the flux material disposed on the one or more pads, wherein depositing the one or more solder balls on the flux material is performed at a temperature greater than 80° C.;

wherein the rosin material and the thixotropic agent are configured to resist softening at the temperature greater than 80° C.;

wherein the rosin material includes one or more of rosin ester, hydrogenated rosin resin, dimerized resin, or modified resin;

wherein the thixotropic agent includes one or more of an organic bentonite, amide wax, or hydrolyzed castor oil;

wherein the rosin material represents 10% to 80% by weight of the flux material without a metal powder; and wherein the thixotropic agent represents 10% to 80% by weight of the flux material without the metal powder.

2. The method of claim 1, wherein the flux material further includes a metal powder, a solvent, an amine, and an acid.

3. The method of claim 1, wherein:
the rosin material has a molecular weight greater than 300; and
the thixotropic agent has a molecular weight greater than 500.

4. The method of claim 1, wherein the flux material has a viscosity ranging from 1 pascal·second (Pa·s) to 300 Pa·s at the temperature greater than 80° C. and a thixotropic index (TI) ranging from 0.1 to 0.4 at the temperature greater than 80° C.

5. The method of claim 1, wherein depositing the one or more solder balls is performed at a temperature ranging between 80° C. and 120° C. as part of a heated solder placement process to reduce warpage of the package substrate during deposition of the one or more solder balls.

6. The method of claim 1, wherein depositing the flux material is performed by pushing the flux material through openings in a stencil adjacent to the one or more pads.

7. The method of claim 1, wherein depositing the one or more solder balls is performed by dropping the one or more solder balls through a patterned grid onto the flux material disposed on the one or more pads, and the flux material has a tackiness greater than 40 gram-force (gf) to facilitate adherence of the one or more solder balls to the flux material at the temperature greater than 80° C.

8. The method of claim 1, further comprising:
performing a reflow process to form a mechanical and electrical bond between the one or more solder balls and the one or more pads.

9. A flux material for a heated solder placement process, the flux material comprising:
a rosin material and a thixotropic agent that is configured to resist softening at a temperature greater than 80° C.;
wherein the rosin material includes one or more of rosin ester, hydrogenated rosin resin, dimerized resin, or modified resin;
wherein the thixotropic agent includes one or more of an organic bentonite, amide wax, or hydrolyzed castor oil;
wherein the rosin material represents 10% to 80% by weight of the flux material without a metal powder; and
wherein the thixotropic agent represents 10% to 80% by weight of the flux material without the metal powder.

10. The flux material of claim 9, further comprising:
a solvent;
an amine; and
an acid.

11. The flux material of claim 9, wherein:
the rosin material has a molecular weight greater than 300; and
the thixotropic agent has a molecular weight greater than 500.

12. The flux material of claim 9, wherein the flux material is mixed with a metal powder to provide a solder paste that resists softening at the temperature greater than 80° C.

13. The flux material of claim 9, wherein:
the flux material has a viscosity ranging from 1 pascal·second (Pa·s) to 300 Pa·s at the temperature greater than 80° C.; and
the flux material has a thixotropic index (TI) ranging from 0.1 to 0.4 at the temperature greater than 80° C.

14. The flux material of claim 9, wherein the flux material has a tackiness greater than 40 gram-force (gf) to facilitate adherence of one or more solder balls to the flux material at the temperature greater than 80° C.

15. The flux material of claim 9, wherein the flux material resists softening at a temperature ranging between 80° C. and 120° C.

16. A package assembly comprising:
a package substrate having one or more pads;
a flux material disposed on the one or more pads, the flux material including a rosin material and a thixotropic agent that are configured to resist softening at a temperature greater than 80° C.; and
a solderable material coupled to the one or more pads using the flux material;
wherein the rosin material includes one or more of rosin ester, hydrogenated rosin resin, dimerized resin, or modified resin;
wherein the thixotropic agent includes one or more of an organic bentonite, amide wax, or hydrolyzed castor oil;
wherein the rosin material represents 10% to 80% by weight of the flux material without a metal powder; and
wherein the thixotropic agent represents 10% to 80% by weight of the flux material without the metal powder.

17. The package assembly of claim 16, wherein the flux material further comprises a solvent, an amine, and an acid.

18. The package assembly of claim 16, wherein:
the rosin material has a molecular weight greater than 300; and
the thixotropic agent has a molecular weight greater than 500.

19. The package assembly of claim 16, wherein the flux material is a low metal loading material that resists softening at the temperature greater than 80° C.

20. The package assembly of claim 16, wherein the flux material has a viscosity ranging from 1 pascal·second (Pa·s) to 300 Pa·s at the temperature greater than 80° C.

21. The package assembly of claim 16, wherein the flux material has a thixotropic index (TI) ranging from 0.1 to 0.4 at the temperature greater than 80° C.

22. The package assembly of claim 16, wherein the solderable material is electrically and mechanically coupled to the one or more pads and includes one or more solder balls.

23. The package assembly of claim 22, wherein the flux material has a tackiness greater than 40 gram-force (gf) to facilitate adherence of the one or more solder balls to the flux material at the temperature greater than 80° C.

24. The package assembly of claim 16, wherein the flux material resists softening during a heated solder placement process performed at a temperature ranging from 80° C. and 120° C. to place the solderable material on the flux material and reduce warpage of the package substrate during the heated solder placement process.

25. The package assembly of claim 16, wherein the package assembly is further coupled with a circuit board via the solderable material.

26. The package assembly of claim 16, wherein the package assembly is part of a laptop, a netbook, a notebook, an ultra book, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

\* \* \* \* \*